(12) United States Patent
Lee et al.

(10) Patent No.: US 8,405,809 B2
(45) Date of Patent: Mar. 26, 2013

(54) LEAD LINE STRUCTURE AND DISPLAY PANEL HAVING THE SAME

(75) Inventors: Wei-Hsin Lee, Hsinchu (TW); Chien-Li Chen, Taichung (TW); Pei-Ling Chiang, Taipei (TW)

(73) Assignee: Au Optronics Corporation, Hsinchu (TW)

( * ) Notice: Subject to any disclaimer, the term of this patent is extended or adjusted under 35 U.S.C. 154(b) by 75 days.

(21) Appl. No.: 13/221,914

(22) Filed: Aug. 31, 2011

(65) Prior Publication Data

US 2012/0262658 A1    Oct. 18, 2012

(30) Foreign Application Priority Data

Apr. 13, 2011    (TW) .............................. 100112819 A (51) Int. Cl.
*G02F 1/1333*    (2006.01)
(52) U.S. Cl. ........................................ 349/138; 349/149
(58) Field of Classification Search .................... 349/149
See application file for complete search history.

(56) References Cited

U.S. PATENT DOCUMENTS
7,304,710 B2 * 12/2007 Ishige et al. .................. 349/149

FOREIGN PATENT DOCUMENTS
CN    101853824    10/2010

* cited by examiner

*Primary Examiner* — Richard Kim
(74) *Attorney, Agent, or Firm* — Jianq Chyun IP Office (57) ABSTRACT

A lead line structure and a display panel having the same are provided. The lead line structure includes first and second lead lines. Each of the first lead lines has a first straight portion and a first oblique portion connected with the first straight portion. The second lead lines and the first lead lines are alternatively arranged, and each of the second lead lines has a second straight portion, a second oblique portion and a contact window. The contact window contacts with the second straight portion so as to electrically connect the second straight portion and the second oblique portion. The first straight portions of the first lead lines and the second straight portions of the second lead lines extend towards the driving device and are electrically connected to the driving device.

30 Claims, 8 Drawing Sheets

LEAD LINE STRUCTURE AND DISPLAY PANEL HAVING THE SAME

CROSS-REFERENCE TO RELATED APPLICATION

This application claims the priority benefit of Taiwan application serial no. 100112819, filed on Apr. 13, 2011. The entirety of the above-mentioned patent application is hereby incorporated by reference herein and made a part of this specification.

BACKGROUND OF THE INVENTION

1. Field of the Invention

The invention relates to a lead line structure and a display panel having the same.

2. Description of Related Art

Generally speaking, a liquid crystal display panel of the liquid crystal displays is constituted by a pixel array substrate, a color filter array substrate and a liquid crystal layer between two substrates. Lead lines will be disposed in the pixel array substrate, so that the pixel array is electrically connected to a driving chip. In order to accompany a contact point of the driving chip, the lead lines disposed between the pixel array and the driving chip are arranged in a fan-out type lead line structure.

As slim border display panels develop, more and more research stresses reducing the dimensions of fan-out type lead line structures. Generally, in order to reduce the dimensions of fan-out type lead line structures, the space between the lead lines and/or width of the lead lines can be reduced. However, reducing the width of the lead lines will cause the resistance of the lead lines to increase. Therefore, it is not suitable to excessively decrease the width of the lead lines. Reducing the space between the lead lines can achieve a fan-out type lead line structure with smaller dimensions. However, excessively decreasing the space between the lead lines can lead to short circuiting between adjacent lead lines. Thus, how to create a new type of lead line structure applied in a slim border display panel, and the lead line structure simultaneously guaranteeing a good yield is an important need.

SUMMARY OF THE INVENTION

The invention provides a lead line structure and a display panel having the same. The lead line structure is applied in a slim border display panel, and the lead line structure also guarantees a good yield.

The invention provides a display panel. The display panel includes a display area and a non display area. The display area includes a pixel array, at least one driving device, a plurality of first lead lines, and a plurality of second lead lines. The pixel array is located in the display area. The driving device is located in the non display area. The first lead lines are located in the non display area and are electrically connected to the pixel array and the driving device. Each of the first lead lines includes a first straight portion and a first oblique portion connected with the first straight portion. The second lead lines are located in the non display area and are electrically connected to the pixel array and the driving device. The second lead lines and the first lead lines are alternately arranged. Each of the second lead lines includes a second straight portion, a second oblique portion, and a contact window. The contact window is in contact with the second straight portion so as to electrically connect the second straight portion and the second oblique portion. In particular, the first straight portions of the first lead lines and the second straight portions of the second lead lines extend towards the driving device and are electrically connected to the driving device.

The invention provides a lead line structure. The lead line structure includes a plurality of first lead lines and a plurality of second lead lines. Each of the first lead lines includes a first straight portion and a first oblique portion connected with the first straight portion. The second lead lines and the first lead lines are alternately arranged, and each of the second lead lines includes a second straight portion, a second oblique portion, and a contact window. The contact window is in contact with the second straight portion so as to electrically connect the second straight portion and the second oblique portion. In particular, wherein a first space between the first straight portion of each first lead line and the adjacent second straight portion of the adjacent second lead line is larger than a second space between the first oblique portion of each first lead line and the adjacent second oblique portion of the adjacent second lead line near the first straight portion and the second straight portion.

Based on the above, the first space between the first straight portion of each first lead line and the adjacent second straight portion of the second lead line is larger than the second space between the first oblique portion of each first lead line and the adjacent second oblique portion of the second lead line. The first lead line is comprised of the first straight portion and the first oblique portion, and the second lead line is comprised of the second straight portion and the contact window. In other words, in the lead line structure of the invention, the layout design of the first straight portion and the second straight portion is loose, while the layout design of the first oblique portion and the second oblique portion is tight, and the first oblique portion and the second oblique portion are located in different film layers. Thus, the lead line structure can avoid short circuiting between adjacent lead lines, and can effectively reduce the dimensions of the lead line structure.

In order to make the aforementioned and other features and advantages of the invention more comprehensible, embodiments accompanying figures are described in detail below.

BRIEF DESCRIPTION OF THE DRAWINGS

The accompanying drawings are included to provide further understanding, and are incorporated in and constitute a part of this specification. The drawings illustrate exemplary embodiments and, together with the description, serve to explain the principles of the disclosure.

DESCRIPTION OF EMBODIMENTS

Figure 1:
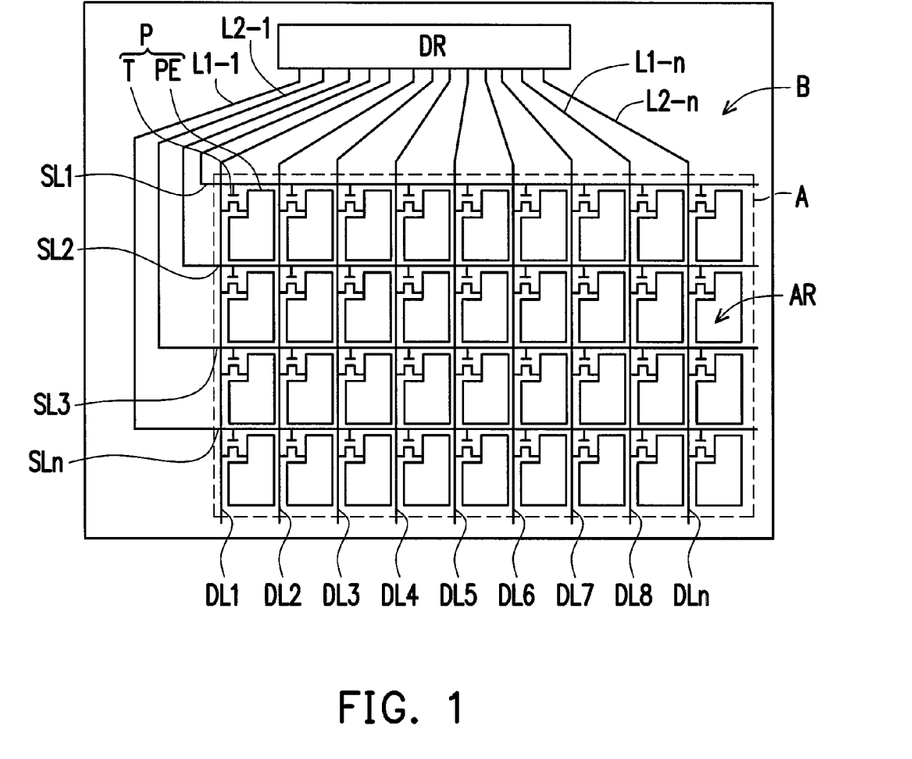
FIG. 1 is a schematic top view of a display panel according to an embodiment of the invention.
Figure 2:
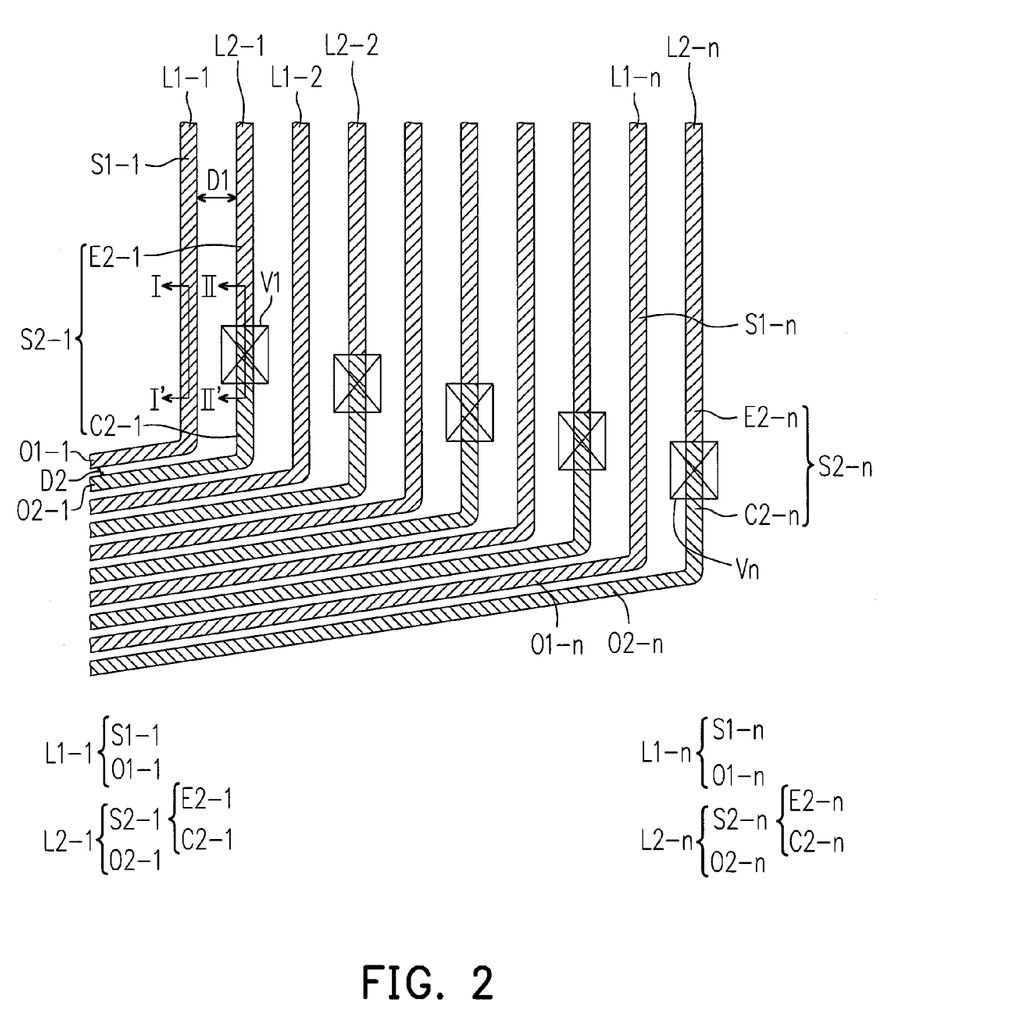
FIG. 2 is a partial schematic view of the lead line structure depicted in FIG. 1.
Figure 3:
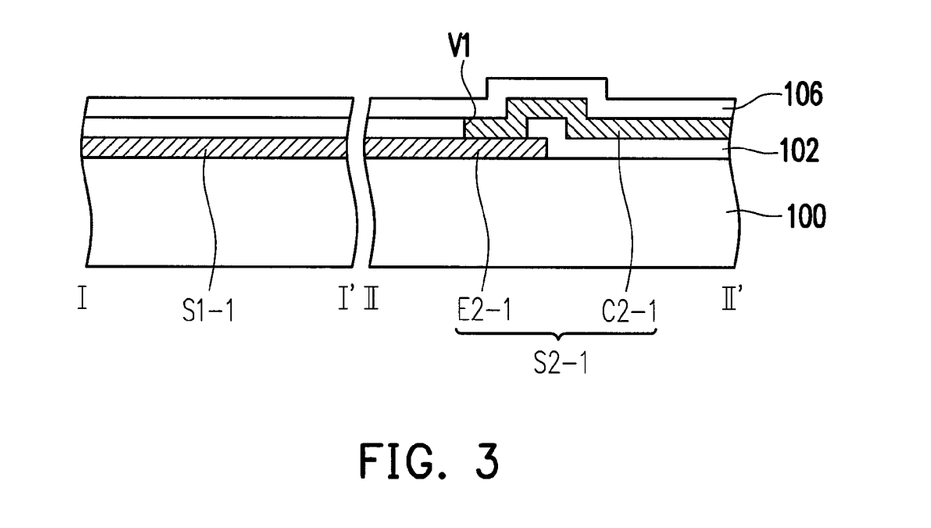
FIG. 3 depicts a schematic cross-sectional view taken along line I-I' and line II-IP in FIG. 2.

FIG. 1 is a schematic top view of a display panel according to an embodiment of the invention. FIG. 2 is a partial schematic top view of the lead line structure depicted in FIG. 1. FIG. 3 depicts a schematic cross-sectional view taken along line I-I′ and line II-II′ in FIG. 2. Referring to FIG. 1, FIG. 2, and FIG. 3, the display panel of the embodiment includes a display area A and a non display area B around the display area A. The display panel includes a pixel array AR, at least one driving device DR, a plurality of first lead lines L1-1~L1-$n$, and a plurality of second lead lines L2-1~L2-$n$.

The pixel array AR is located in the display area A. According to the embodiment, the pixel array AR includes a plurality of scan lines SL1~SL$n$, a plurality of data lines DL1~DL$n$, and a plurality of pixel structures P.

The scan lines SL1~SL$n$ and the data lines DL1~DL$n$ cross over each other, and there is an insulating layer between the scan lines SL1~SL$n$ and the data lines DL1~DL$n$. In other words, an extending direction of the scan lines SL1~SL$n$ is not parallel with an extending direction of the data lines DL1~DL$n$. Moreover, it is favorable for the extending direction of the scan lines SL1~SL$n$ to be perpendicular to the extending direction of the data lines DL1~DL$n$. Also, the scan lines SL1~SL$n$, and data lines DL1~DL$n$ are usually fabricated using metal material for conductivity. However, the invention is not limited thereto. According to other embodiments, the scan lines SL1~SL$n$, and the data lines DL1~DL$n$ can also adopt other conductive materials. For example, an alloy, a metal nitride material, a metal oxide material, a metal oxynitride material, other suitable materials, or a stacked conductive layer of different materials may be adopted.

In addition, the pixel structure P includes an active device T and a pixel electrode PE. The active device T can be a bottom gate thin film transistor or a top gate thin film transistor, and includes a gate, a channel, a source, and a drain. The active device T is electrically connected to one of the corresponding scan lines SL1~SL$n$ and one of the corresponding data lines DL1~DL$n$. In addition, the active device T is electrically connected to the pixel electrode PE.

The driving device DR is located in the non display area B. The driving device DR can provide the pixel array AR a driving signal to control the pixel array AR to display an image. In the embodiment, the driving device DR is disposed on one side of the display area A. However, the invention is not limited thereto. According to other embodiments, the driving device DR can also be disposed on two or three sides of the display area A, or on all four sides of the display area A.

The first lead lines L1-1~L1-$n$ and the second lead lines L2-1~L2-$n$ are located in the non display area B. The first lead lines L1-1~L1-$n$ and the second lead lines L2-1~L2-$n$ are electrically connected to the pixel array AR and the driving device DR. Each of the first lead lines L1-1~L1-$n$ and the second lead lines L2-1~L2-$n$ are electrically connected with each of the corresponding scan lines SL1~SL$n$ and data lines DL1~DL$n$. In other words, through the configuration of the first lead lines L1-1~L1-$n$ and the second lead lines L2-1~L2-$n$, the driving signal of the driving device DR can be transmitted to the pixel array AR. In addition, the first lead lines L1-1~L1-$n$ and the second lead lines L2-1~L2-$n$ are alternately arranged. In other words, the first lead lines and the second lead lines are arranged sequentially from right to left, making the sequence the first lead line L1-1, the second lean line L2-1, the first lead line. L1-2, the second lead line L2-2, . . . , the first lead line L1-$n$, and the second lead line L2-$n$.

Similarly, in consideration of electrical conductivity, the first lead lines L1-1~L1-$n$ and the second lead lines L2-1~L2-$n$ are normally made of metallic materials. However, the invention is not limited thereto. According to other embodiments, the first lead lines L1-1~L1-$n$ and the second lead lines L2-1~L2-$n$ can be made from other conductive materials. For example, an alloy, a metal nitride material, a metal oxide material, a metal oxynitride material, other suitable materials, or a stacked conductive layer of different materials may be adopted. In addition, the width of the first lead lines L1-1~L1-$n$ and the second lead lines L2-1~L2-$n$ are each, for example, 3 to 6 micrometers. However, the invention is not limited thereto.

According to the embodiment, as seen in FIG. 2, the first lead lines L1-1~L1-$n$ include first straight portions S1-1~S1-$n$ and first oblique portions O1-1~O1-$n$ connected with the first straight portions S1-1~S1-$n$. In other words, the first lead line L1-1 includes the first straight portion S1-1 and the first oblique portion O1-1, the first lead line L1-2 includes the first straight portion S1-2 and the first oblique portion O1-2, and the first lead line L1-$n$ includes the first straight portion S1-$n$ and the first oblique portion O1-$n$. An extending direction of the first straight portions S1-1~S1-$n$ is not parallel with an extending direction of the first oblique portions O1-1~O1-$n$. That is to say, an angle between the extending direction of the first straight portions S1-1~S1-$n$ and the extending direction of the first oblique portions O1-1~O1-$n$ is not 0 or 180 degrees. In addition, a width of the first straight portions S1-1~S1-$n$ and a width of the first oblique portions O1-1~O1-$n$ are generally the same, but can also be different according to the need of the designer. The invention is not limited thereto.

The second lead lines L2-1~L2-$n$ includes second straight portions S2-1~S2-$n$, second oblique portions O2-1~O2-$n$, and contact windows V1~V$n$. In other words, the second lead line L2-1 includes the second straight portion S2-1, the second oblique portion O2-1, and the contact window V1, the second lead line L2-2 includes the second straight portion S2-2, the second oblique portion O2-2, and the contact window V2, and the second lead line L2-$n$ includes the second straight portion S2-$n$, the second oblique portion O2-$n$, and the contact window V$n$. In particular, according to the embodiment of FIG. 2, the second straight portions S2-1~S2-$n$ includes extension portions E2-1~E2-$n$ and connection portions C2-1~C2-$n$. For example, the second straight portion S2-1 includes the extension portion E2-1 and the connection portion C2-1, the second straight portion S2-2 includes the extension portion E2-2 and the connection portion C2-2, and the second straight portion S2-$n$ includes the extension portion E2-$n$ and the connection portion C2-$n$. The connection portions C2-1~C2-$n$ are connected with the second oblique portions O2-1~O2-$n$. The contact windows V1~V$n$ are located between the extension portions E2-1~E2-$n$ and the connection portions C2-1~C2-$n$, so as to electrically connect the extension portions E2-1~E2-$n$ and the connection portions C2-1~C2-$n$, respectively.

Using the second lead line L2-1 as an example, the second lead line L2-1 includes the second straight portion S2-1 (including the extension portion E2-1 and the connection portion C2-1), the second oblique portion O2-1, and the contact window V1. The extension portion E2-1 of the second straight portion S2-1 extends to the contact window V1, the connection portion C2-1 of the second straight portion S2-1 extends from the contact window V1 towards the second oblique portion O2-1 and is connected with the second oblique portion O2-1, and the contact window V1 is electrically connected with the extension portion E2-1 of the second straight portion S2-1 and the connection portion C2-1 of the second straight portion S2-1.

Similarly, the extending direction of the second straight portions S2-1~S2-$n$ of the second lead lines L2-1~L2-$n$ is not parallel with the extending direction of the second oblique portions O2-1~O2-$n$. That is to say, an angle between the extending direction of the second straight portions S2-1~S2-$n$ and the extending direction of the second oblique portions O2-1~O2-$n$ is not 0 or 180 degrees. In addition, a width of the second straight portions S2-1~S2-$n$ and a width of the second oblique portions O2-1~O2-$n$ are generally the same, but can also be different according to the need of the designer. The invention is not limited thereto.

In addition, the first straight portions S1-1~S1-$n$ of the first lead lines L1-1~L1-$n$ and the second straight portions S2-1~S2-$n$ of the second lead lines L2-1~L2-$n$ are substantially parallel. The first straight portions S1-1~S1-$n$ of the first lead lines L1-1~L1-$n$ and the second straight portions S2-1~S2-$n$ of the second lead lines L2-1~L2-$n$ extend towards the driving device DR and are electrically connected to the driving device DR. The first oblique portions O1-1~O1-$n$ of the first lead lines L1-1~L1-$n$ and the second oblique portions O2-1~O2-$n$ of the second lead lines L2-1~L2-$n$ are substantially parallel. The first oblique portions O1-1~O1-$n$ of the first lead lines L1-1~L1-$n$ and the second oblique portions O2-1~O2-$n$ of the second lead lines L2-1~L2-$n$ extend towards the pixel array AR and are electrically connected to the pixel array AR.

In particular, there is a first space D1 between each of the first straight portions S1-1~S1-$n$ of the first lead lines L1-1~L1-$n$ and each of the second straight portions S2-1~S2-$n$ of the adjacent second lead lines L2-1~L2-$n$. For example, there is the first space D1 between the first straight portion S1-1 and the second straight portion S2-1. In addition, there is a second space D2 between each of the first oblique portions O1-1~O1-$n$ of the first lead lines L1-1~L1-$n$ and each of the second oblique portions O2-1~O2-$n$ of the adjacent second lead lines L2-1~L2-$n$. For example, there is the second space D2 between the first oblique portion O1-1 and the second oblique portion O2-1. The first space D1, which is between each of the first straight portions S1-1~S1-$n$ of the first lead lines L1-1~L1-$n$ and each of the second straight portions S2-1~S2-$n$ of the adjacent second lead lines L2-1~L2-$n$, is greater than the second space D2, which is between each of the first oblique portions O1-1~O1-$n$ of the first lead lines L1-1~L1-$n$ and each of the second oblique portions O2-1~O2-$n$ of the adjacent second lead lines L2-1~L2-$n$ near the first straight portion S1-1~S1-$n$ and the second straight portion S2-1~S2-$n$. For example, the first space D1 is about 10 to 20 micrometers, and the second space D2 is about 1.5 to 6 micrometers, but the invention is not limited thereto.

Thus, the arrangement between the first straight portions S1-1~S1-$n$ of the first lead lines L1-1~L1-$n$ and the second straight portions S2-1~S2-$n$ of the second lead lines L2-1~L2-$n$ is loose, and the arrangement between the first oblique portions O1-1~O1-$n$ of the first lead lines L1-1~L1-$n$ and the second oblique portions O2-1~O2-$n$ of the second lead lines L2-1~L2-$n$ is tight.

It should be noted that in the embodiment, as seen in FIG. 2 and FIG. 3, the first lead lines L1-1~L1-$n$ (including the first straight portions S1-1~S1-$n$ and the first oblique portions O1-1~O1-$n$) and the extension portions E2-1~E2-$n$ of the second straight portions S1-1~S1-$n$ of the second lead lines L2-1~L2-$n$ are made of a first conductive layer. The connection portions C2-1~C2-$n$ of the second straight portions S2-1~S2-$n$ and the second oblique portions O2-1~O2-$n$ of the second lead lines L2-1~L2-$n$ are made of a second conductive layer. In the embodiment, as seen in FIG. 3, the first conductive layer (the first lead lines L1-1~L1-$n$ and the extension portions E2-1~E2-$n$ of the second straight portions S2-1~S2-$n$ of the second lead lines L2-1~L2-$n$) is located on a substrate 100, and a first insulating layer 102 covers the first conductive layer. The second conductive layer (the connection portions C2-1~C2-$n$ of the second straight portions S2-1~S2-$n$ and the second oblique portions O2-1~O2-$n$ of the second lead lines L2-1~L2-$n$) is located on the first insulating layer 102, and a second insulating layer 106 covers the first insulating layer 102 and the second conductive layer. In particular, the contact windows V1-Vn are located in the first insulating layer 102, so as to electrically connect the extension portions E2-1~E2-$n$ on the first conductive layer and the connection portions C2-1~C2-$n$ on the second conductive layer. The materials of the first insulating layer 102 and the second insulating layer 106 can include an inorganic material (e.g. silicon oxide, silicon nitride, silicon oxynitride, other suitable materials, or a stacked layer of at least two of the above materials), an organic material, other suitable materials, or a combination of the above.

According to the embodiment, since the first space D1 between the first straight portions S1-1~S1-$n$ and the second straight portions S2-1~S2-$n$ is large enough, thus the extension portions E2-1~E2-$n$ of the second straight portions S2-1~S2$n$ and the first straight portions S1-1~S1-$n$ fabricated on the same layer will not have the problem of short circuiting. Since the second space D2 between the first oblique portions O1-1~O1-$n$ and the second oblique portions O2-1~O2-$n$ is small, thus the first oblique portions O1-1~O1-$n$ and the second oblique portions O2-1~O2$n$ are fabricated in different conductive layers to avoid short circuiting. The layout method of the aforementioned lead line structure can allow the overall area of the lead line structure to be small, and can be applied in slim border display panels.

It should be noted that in the embodiment of FIG. 2 and FIG. 3, the first straight portions S1-1~S1-$n$ and the extension portions E2-1~E2-$n$ of the second straight portions S2-1~S2-$n$ are formed of the first conductive layer, and so is covered by the first insulating layer 102 and the second insulating layer 106. Another advantage of the design of the lead line structure is that when the lead line structure receives an external force, the two insulating layers can protect the lead line structure from damage.

Figure 4:
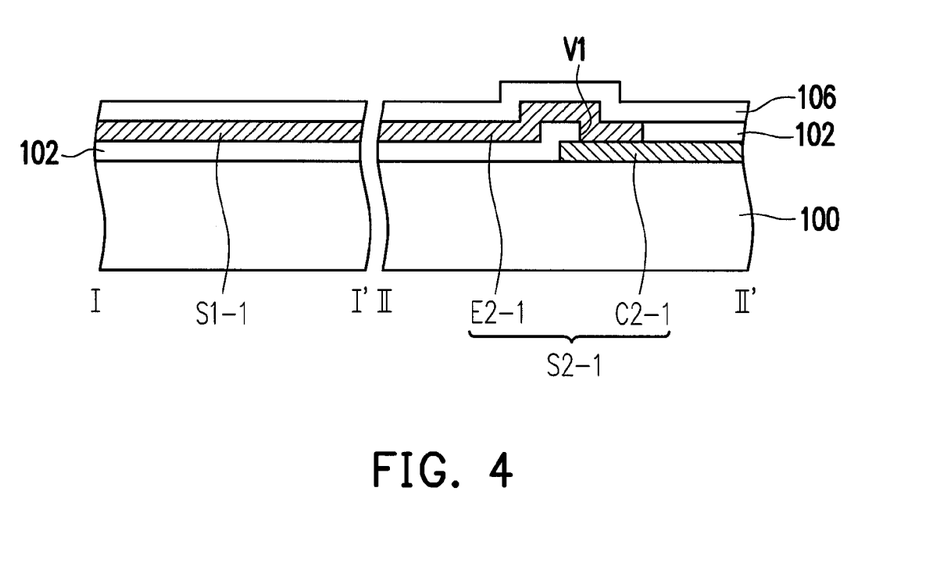
FIG. 4 is a schematic cross-sectional view of a lead line structure according to another embodiment of the invention.

In the embodiment of FIG. 3, the first conductive layer (the first lead lines L1-1~L1-$n$ and the extension portions E2-1~E2-$n$ of the second straight portions S2-1~S2-$n$ of the second lead lines L2-1~L2-$n$) is located on the substrate 100, and the second conductive layer (the second oblique portions O2-1~O2-$n$ of the second lead lines L2-1~L2-$n$ and the connection portions C2-1~C2-$n$ of the second straight portions S2-1~S2-$n$) is disposed above the first conductive layer. However, the invention is not limited thereto. According to other embodiments, the first conductive layer can be disposed above the second conductive layer, as seen in FIG. 4. In the embodiment of FIG. 4, the first insulating layer 102 covers the second conductive layer (comprising the second oblique portions O2-1~O2-$n$ of the second lead lines L2-1~L2-$n$ and the connection portions C2-1~C2-$n$ of the second straight portions S2-1~S2-$n$), the first conductive layer (comprising the first lead lines L1-1~L1-$n$ and the extension portions E2-1~E2-$n$ of the second straight portions S2-1~S2-$n$ of the second lead lines L2-1~L2-$n$) is located on the first insulating layer 102, and the second insulating layer 106 covers the first conductive layer (comprising the first lead lines L1-1~L1-$n$ and the extension portions E2-1~E2-$n$ of the second straight portions S2-1~S2-$n$ of the second lead lines L2-1~L2-$n$).

FIG. 4 is a schematic cross-sectional view of a lead line structure according to another embodiment of the invention. The embodiment of FIG. 4 is similar to the embodiment of FIG. 3. Thus, identical components will be denoted with the same numerals and not repeated herein. In the embodiment of FIG. 4, the second conductive layer (the connection portions C2-1~C2-$n$ of the second straight portions S2-1~S2-$n$ and the second oblique portions O2-1~O2-$n$ of the second lead lines L2-1~L2-$n$) is located on the substrate 100, and the first insulating layer 102 covers the second conductive layer. The first conductive layer (the extension portions E2-1~E2-$n$ of the second straight portions S2-1~S2-$n$ of the second lead lines L2-1~L2-$n$ and the first lead lines L1-1~L1-$n$) is located on the first insulating layer 102, and the second insulating layer 106 covers the first insulating layer 102 and the first conductive layer. Similarly, the contact windows V1-Vn are located in the first insulating layer 102, so as to electrically connect the extension portions E2-1~E2-$n$ and the connection portions C2-1~C2-$n$.

Figure 5:
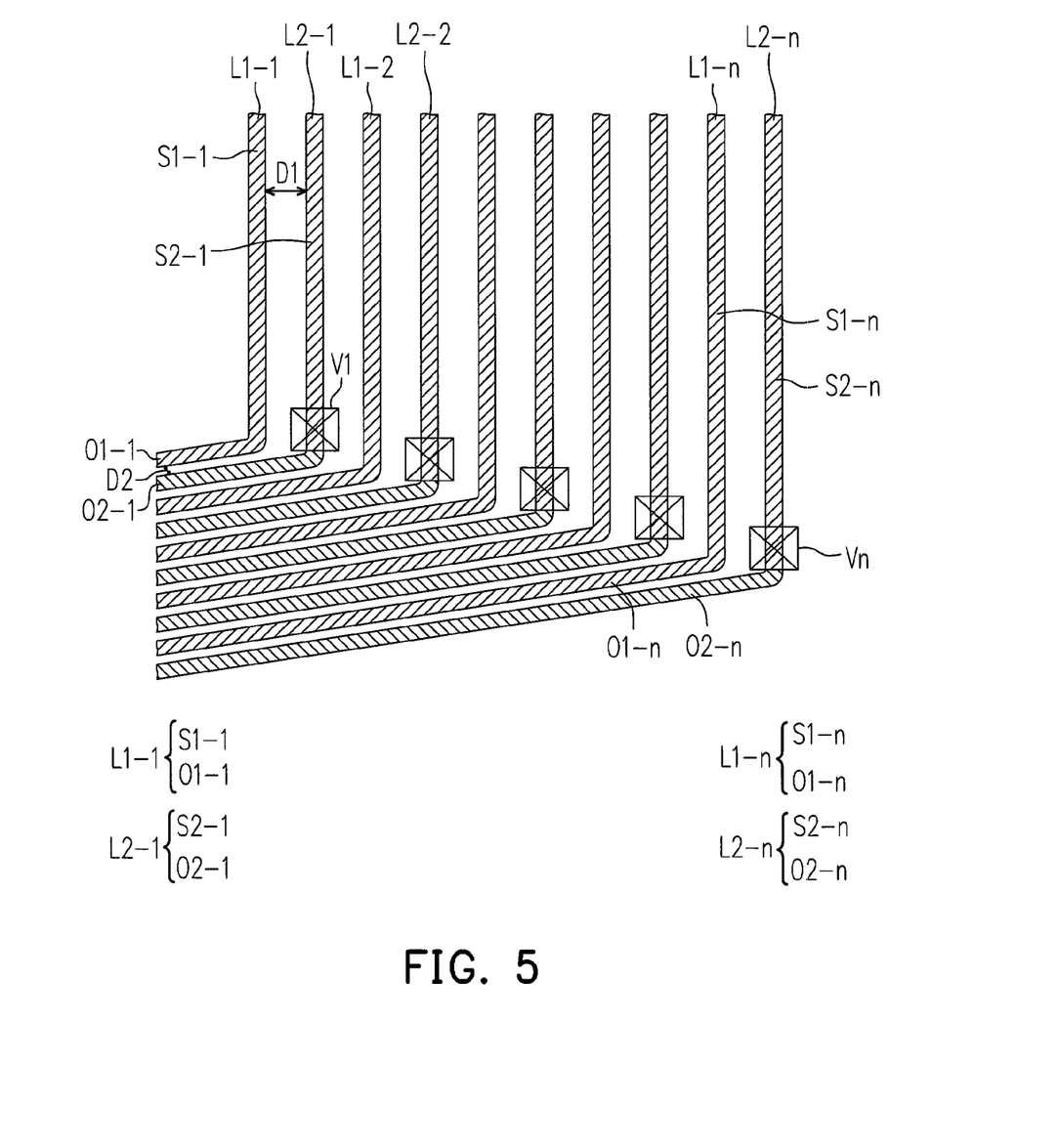
FIG. 5 is a partial schematic view of a lead line structure according to another embodiment of the invention.

FIG. 5 is a partial schematic view of a lead line structure according to another embodiment of the invention. The embodiment of FIG. 5 is similar to the embodiment of FIG. 2. Thus, identical components will be denoted with the same numerals and not repeated herein. The difference between the embodiment of FIG. 5 and the embodiment of FIG. 2 is that the contact windows V1~Vn are located between the second straight portions S2-1~S2-$n$ and the second oblique portions O2-1~O2-$n$. In other words, in the embodiment, the first lead lines L1-1~L1-$n$ (including the first straight portions S1-1~S1-$n$ and the first oblique portions O1-1~O1-$n$) and the second straight portions S2-1~S2-$n$ of the second lead lines L2-1~L2-$n$ are made of the first conductive layer, but the second oblique lines O2-1~O2-$n$ of the second lead lines L2-1~L2-$n$ are made of the second conductive layer. The contact windows V1~Vn are disposed between the second straight portions S2-1~S2-$n$ and the second oblique portions O2-1~O2-$n$.

In addition, the second conductive layer (the second oblique portions O2-1~O2-$n$ of the second lead lines L2-1~L2-$n$) can be disposed under the first conductive layer (the second straight portions S2-1~S2-$n$ of the second lead lines L2-1~L2-$n$ and the first lead lines L1-1~L1-$n$). In other words, the second conductive layer (the second oblique portions O2-1~O2-$n$ of the second lead lines L2-1~L2-$n$) is located on the substrate, and is covered by the first insulating layer. The first conductive layer (the second straight portions S2-1~S2-$n$ of the second lead lines L2-1~L2-$n$ and the first lead lines L1-1~L1-$n$) is located on the first insulating layer, and is covered by the second insulating layer.

Of course, the first conductive layer (the second straight portions S2-1~S2-$n$ of the second lead lines L2-1~L2-$n$ and the first lead lines L1-1~L1-$n$) can also be disposed under the second conductive layer (the second oblique portions O2-1~O2-$n$ of the second lead lines L2-1~L2-$n$). In other words, the first conductive layer (the second straight portions S2-1~S2-$n$ of the second lead lines L2-1~L2-$n$ and the first lead lines L1-1~L1-$n$) is disposed on the substrate, and is covered by the first insulating layer. The second conductive layer (the second oblique portions O2-1~O2-$n$ of the second lead lines L2-1~L2-$n$) is located on the first insulating layer, and is covered by the second insulating layer.

Figure 6:
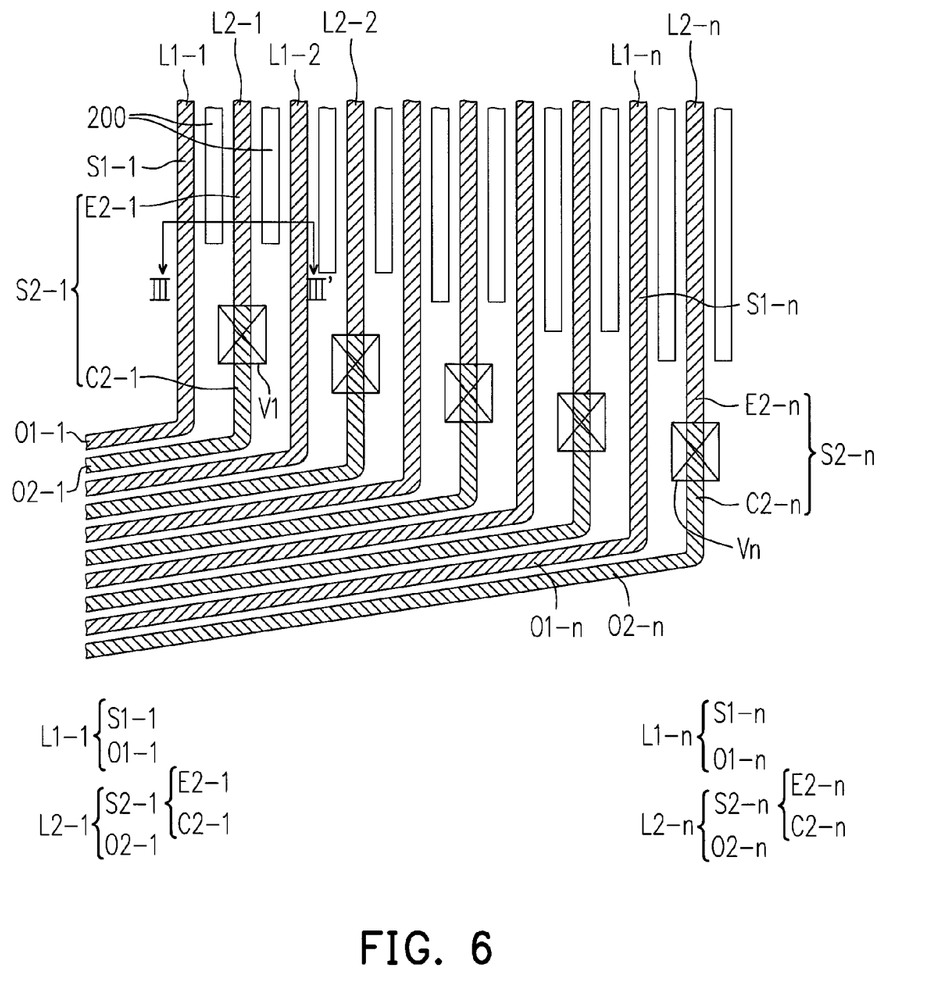
FIG. 6 is a partial schematic view of a lead line structure according to another embodiment of the invention.
Figure 7:
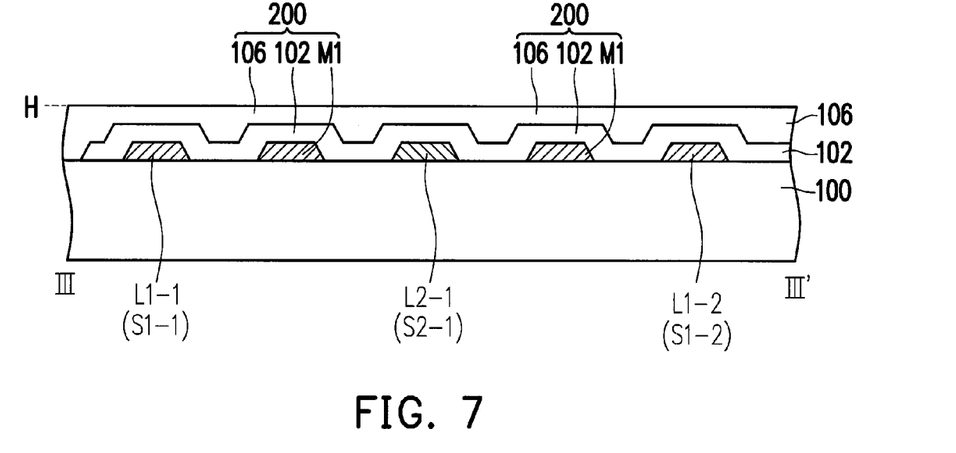
FIG. 7 is a schematic cross-sectional view taken along a line depicted in FIG. 6.

FIG. 6 is a partial schematic view of a lead line structure according to another embodiment of the invention. FIG. 7 is a schematic cross-sectional view taken along a line depicted in FIG. 6. Referring to FIGS. 6 and 7, the embodiment is similar to the embodiment shown in FIG. 2. Thus, identical components will be denoted with the same numerals and not repeated herein. Referring to the embodiment of FIG. 6 and FIG. 7, the lead line structure further includes a plurality of protection structures 200 located between each second lead line L2-1~L2-$n$ and the adjacent first lead line L1-1~L1-$n$. For example, the protection structure 200 is disposed between the second lead line L2-1 and the first lead line L1-1, and the protection structure 200 is also disposed between the second lead line L2-1 and the first lead line L1-2.

In particular, a height of the protection structures 200 are greater than or equal to a height of the first lead lines L1-1~L1-$n$ or a height of the second lead lines L2-1~L2-$n$, preferably, a height of the protection structure 200 is greater than or equal to the height of the second insulating layer 106 above the first lead lines L1-1~L1-$n$ and the second lead lines L2-1~L2-$n$. According to the embodiment, the protection structure 200 is formed through a plurality of stacked film layers. The film layers can be a metal material, an insulating material, a semiconductor material, or a metal oxide material, wherein the material is adopted mainly according to the fabrication of the pixel array AR of the display panel.

In the embodiment of FIG. 7, the protection structure 200 is formed of the stacking of a conductive pattern M1, the first insulating layer 102, and the second insulating layer 106. The protection structure 200 is disposed between each of the first straight portions S1-1~S1-$n$ of the first lead lines L1-1~L1-$n$ and the second straight portion S2-1~S2-$n$ of the adjacent second lead line L2-1~L2-$n$. The conductive pattern M1 is, for example, a metal material. In addition, the height H of the protection structure 200 is the same as the height H of the second insulating layer 106 above the first straight portions S1-1~S1-$n$ of the first lead lines L1-1~L1-$n$ and the second straight portions S2-1~S2-$n$ of the second lead lines L2-1~L2-$n$.

Based on the above, the protection structure 200 is disposed between each second lead line L2-1~L2-$n$ and the adjacent first lead line L1-1~L1-$n$, and the height of the protection structure 200 is greater than or equal to the height of the second insulating layer above the first lead lines L1-1~L1-$n$ and the second lead lines L2-1~L2-$n$. Thus, when the lead line structure receives an external force, the protection structure 200 can reduce probability of damage towards the first lead lines L1-1~L1-$n$ and the second lead lines L2-1~L2-$n$.

It should be noted that if the top layer of the multi-layered protection structure 200 is an insulating material, the protection structure 200 will not cause the two sides of the lead lines to short circuit. However, the invention is not limited thereto, if the space between the two sides of the lead line and the protection structure 200 is large enough, the protection structure 200 may use a material other than an insulating material as the top layer.

In addition, in the embodiment, the protection structure 200 is disposed between each of the second straight portions S2-1~S2-$n$ of the second lead lines L2-1~L2-$n$ and the first straight portions S1-1~S1-$n$ of the adjacent first lead lines L1-1~L1-$n$. For example, the protection structure 200 is disposed between the second straight portion S2-1 of the second lead line L2-1 and the first straight portion S1-1 of the first lead line L1-1, and the protection structure 200 is also disposed between the second straight portion S2-1 of the second lead line L2-1 and the first straight portion S1-2 of the first lead line L1-2. However, the invention is not limited thereto.

According to other embodiments, if the distance D2 between each of the first oblique portions O1-1~O1-n of the first lead lines L1-1~L1-n and the adjacent second oblique portions O2-1~O2-n of the second lead lines L2-1~L2-n is large enough, the protection structure 200 can be further disposed between each of the second oblique portions O2-1~O2-n of the second lead lines L2-1~L2-n and the adjacent first oblique portions O1-1~O1-n of the first lead lines L1-1~L1-n.

Figure 8:
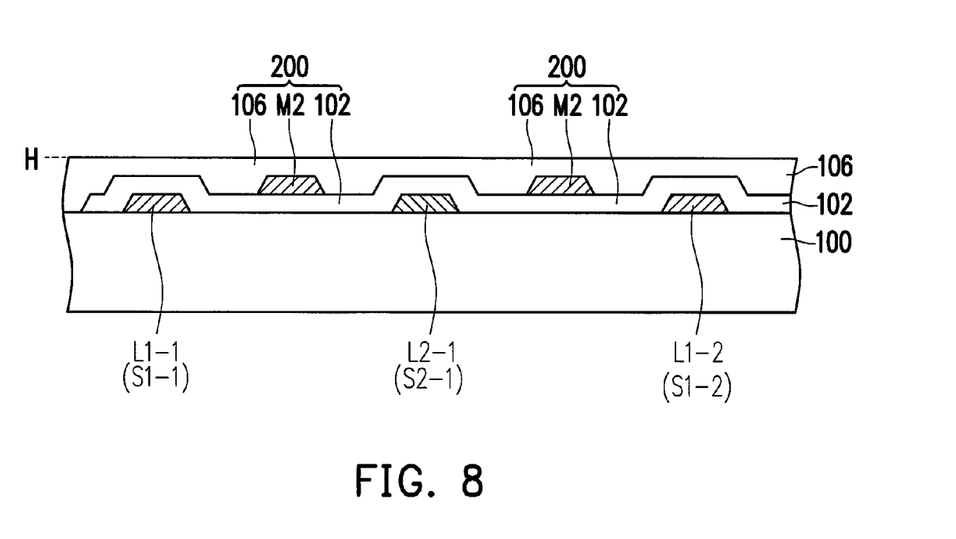
FIG. 8 is a schematic cross-sectional view of a lead line structure according to another embodiment of the invention.

FIG. 8 is a schematic cross-sectional view of a lead line structure according to another embodiment of the invention. Referring to FIG. 8, the embodiment is similar to the embodiment shown in FIG. 7. Thus, identical components will be denoted with the same numerals and will not be repeated herein. In the embodiment of FIG. 8, the protection structure is formed by the stacking of the first insulating layer 102, a conductive pattern M2, and the second insulating layer 106. The conductive pattern M2 is, for example, a metal material. In addition, the height H of the protection structure 200 is the same as the height H of the second insulating layer 106 above the first straight portions S1-1~S1-n of the first lead lines L1-1~L1-n and the second straight portions S2-1~S2-n of the second lead lines L2-1~L2-n.

Based on the above, the protection structure 200 is disposed between each second lead line L2-1~L2-n and the adjacent first lead line L1-1~L1-n, and the height of the protection structure 200 is greater than or equal to the height of the second insulating layer 106 above the first lead lines L1-1~L1-n and the second lead lines L2-1~L2-n. Thus, when the lead line structure receives an external force, the protection structure 200 can reduce probability of damage towards the first lead lines L1-1~L1-n and the second lead lines L2-1~L2-n.

Figure 9:
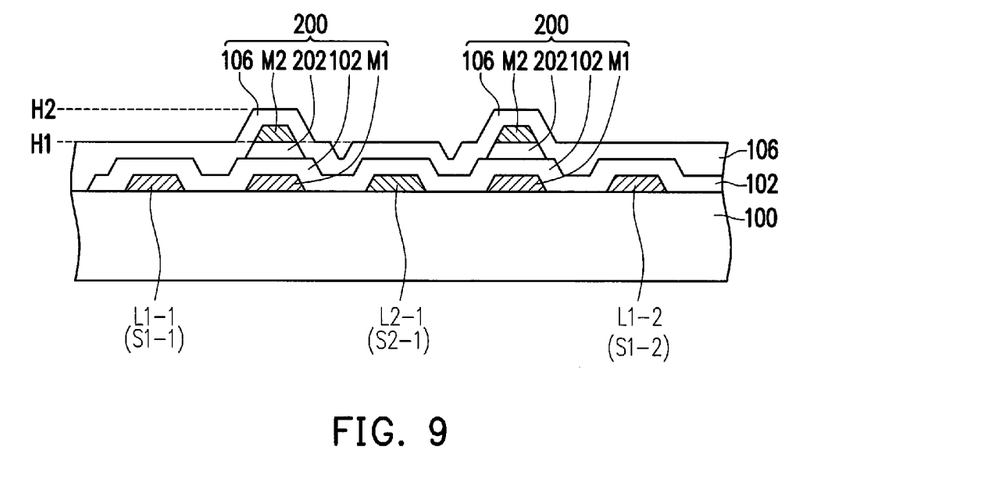
FIG. 9 is a schematic cross-sectional view of a lead line structure according to another embodiment of the invention.

FIG. 9 is a schematic cross-sectional view of a lead line structure according to another embodiment of the invention. Referring to FIG. 9, the embodiment is similar to the embodiment shown in FIG. 7. Thus, identical components will be denoted with the same numerals and will not be repeated herein. In the embodiment of FIG. 9, the protection structure is formed by the stacking of the conductive pattern M1, the first insulating layer 102, a middle layer 202, the conductive pattern M2, and the second insulating layer 106. The conductive pattern M1 is, for example, a metal material. The middle layer 202 is, for example, a semiconductor material or a dielectric layer material, which can be amorphous silicon, poly-silicon, micro-silicon, doped silicon material, organic material, silicon oxide, or silicon nitride, but the invention is not limited thereto. The conductive pattern M2 is, for example, a metal material. In addition, the height H2 of the protection structure 200 is larger than the height H1 of the second insulating layer 106 above the first straight portions S1-1~S1-n of the first lead lines L1-1~L1-n and the second straight portions S2-1~S2-n of the second lead lines L2-1~L2-n. In another embodiment, in the stacked structure of the protection structure 200, only one of the conductive patterns M1 or M2 may be included. In other words, there is no requirement for the protection structure 200 to simultaneously have both the conductive patterns M1 and M2.

Based on the above, the protection structure 200 is disposed between each second lead line L2-1~L2-n and the adjacent first lead line L1-1~L1-n, and the height H2 of the protection structure 200 is greater than the height H1 of the second insulating layer above the first lead lines L1-1~L1-n and the second lead lines L2-1~L2-n. Thus, when the lead line structure receives an external force, the protection structure 200 first receives the external force, and can protect the first lead lines L1-1~L1-n and the second lead lines L2-1~L2-n from receiving damage.

Figure 10:
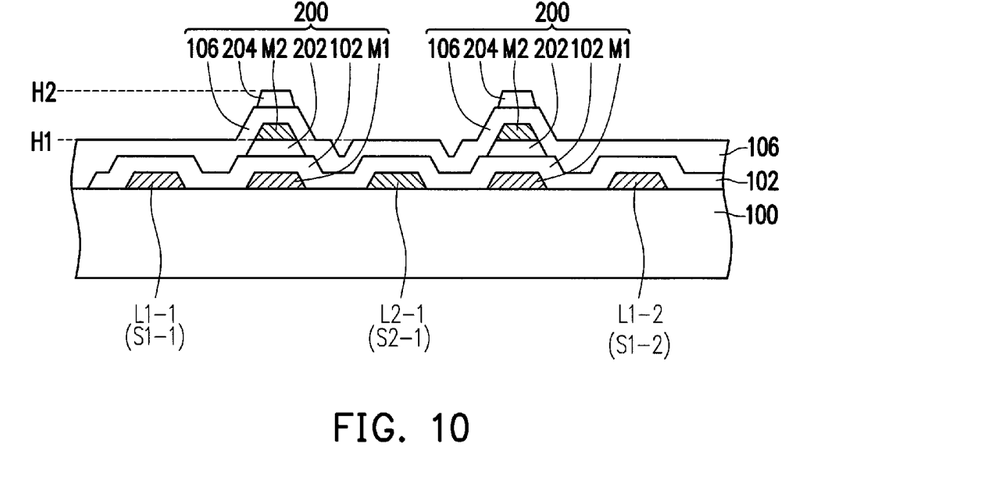
FIG. 10 is a schematic cross-sectional view of a lead line structure according to another embodiment of the invention.

FIG. 10 is a schematic cross-sectional view of a lead line structure according to another embodiment of the invention. Referring to FIG. 10, the embodiment is similar to the embodiment shown in FIG. 7. Thus, identical components will be denoted with the same numerals and will not be repeated herein. In the embodiment of FIG. 10, the protection structure is formed by the stacking of the conductive pattern M1, the first insulating layer 102, the middle layer 202, the conductive pattern M2, the second insulating layer 106, and a cover layer 204. The conductive pattern M1 is, for example, a metal material. The middle layer 202 is, for example, a semiconductor material or a dielectric layer material, which can be amorphous silicon, poly-silicon, micro-silicon, doped silicon material, organic material, silicon oxide, or silicon nitride, but the invention is not limited thereto. The conductive pattern M2 is, for example, a metal material. The cover layer 204 is, for example, a metal oxide material or an insulating material. In addition, the height H2 of the protection structure 200 is larger than the height H1 of the second insulating layer 106 above the first straight portions S1-1~S1-n of the first lead lines L1-1~L1-n and the second straight portions S2-1~S2-n of the second lead lines L2-1~L2-n. In another embodiment, in the stacked structure of the protection structure 200, only one of the conductive patterns M1 or M2 may be included, and the top layer will be covered with the cover layer 204. In other words, there is no requirement for the protection structure 200 to simultaneously have both the conductive patterns M1 and M2.

Similarly, the protection structure 200 is disposed between each second lead line L2-1~L2-n and the adjacent first lead line L1-1~L1-n, and the height H2 of the protection structure 200 is greater than the height H1 of the second insulating layer above the first lead lines L1-1~L1-n and the second lead lines L2-1~L2-n. Thus, when the lead line structure receives an external force, the protection structure 200 first receives the external force, and can protect the first lead lines L1-1~L1-n and the second lead lines L2-1~L2-n from receiving damage.

In the embodiment of FIG. 1, the driving device DR is disposed at one of the sides of the display area A, wherein the scan lines SL1~SLn and the data lines DL1~DLn are electrically connected to the driving device DR. In the display panel of the following embodiment, the driving device is disposed on two sides of the display area A, and the scan lines SL1~SLn and the data lines DL1~DLn are each electrically connected to the corresponding driving device DR.

Figure 11:
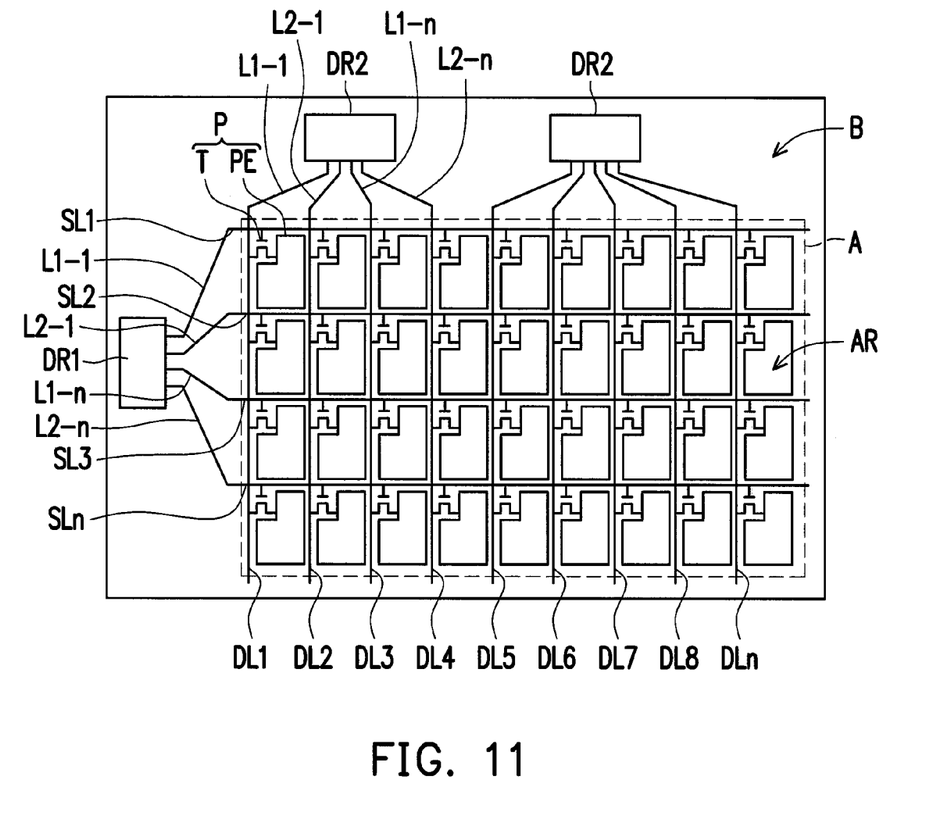
FIG. 11 is a schematic top view of a display panel according to another embodiment of the invention.

FIG. 11 is a schematic top view of a display panel according to another embodiment of the invention. The embodiment is similar to the embodiment shown in FIG. 1, and identical components will be denoted with the same numerals and not repeated herein. Referring to FIG. 11, in the embodiment, the driving devices DR1, DR2 are located in the non display area B on the two sides of the display area A. The driving devices DR1, DR2 can provide the pixel array AR a specific driving signal to control the driving devices DR1, DR2 to display a specific image.

In addition, the first lead lines L1-1~L1-n and the second lead lines L2-1~L2-n are located in the non display area B. The first lead lines L1-1~L1-n and the second lead lines L2-1~L2-n are electrically connected to the pixel array AR and the driving devices DR1, DR2. Similarly, through the configuration of the first lead lines L1-1~L1-n and the second lead lines L2-1~L2-n, the driving signal of the driving devices DR1, DR2 can be transmitted to the pixel array AR. In addition, the first lead lines L1-1~L1-n and the second lead lines L2-1~L2-n are alternately arranged. For example, for connecting with driving device DR2, the first lead lines and the second lead lines are arranged sequentially from right to left, making the sequence the first lead line L1-1, the second lean line L2-1, the first lead line L1-2, the second lead line L2-2, . . . , the first lead line L1-n, and the second lead line L2-n.

In particular, the lead line structure (including the first lead lines L1-1~L1-n and the second lead lines L2-1~L2-n) of the display panel of FIG. 11 can adopt any of the lead line structures described in the embodiments of FIGS. 2 through 10.

Generally, the first space between the first straight portion of each first lead line and the adjacent second straight portion of the second lead line is larger than the second space between the first oblique portion of each first lead line and the adjacent second oblique portion of the second lead line. The first lead line is comprised of the first straight portion and the first oblique portion, and the second lead line is comprised of the second straight portion and the contact window. In other words, in the lead line structure of the invention, the layout design of the first straight portion and the second straight portion is loose, while the layout design of the first oblique portion and the second oblique portion is tight, and the first oblique portion and the second oblique portion are located in different film layers. Thus, the lead line structure can avoid short circuiting between adjacent lead lines, and can effectively reduce the dimensions of the lead line structure.

In addition, if the first straight portions and the second straight portions (extension portion) are disposed in a lower conductive layer, then the top is covered with the first insulating layer and the second insulating layer. Another advantage of the design of the lead line structure is that when the lead line structure receives an external force, the two insulating layers can protect the lead line structure from damage.

Furthermore, if there are protection structures disposed between the first lead lines and the adjacent second lead lines, the protection structures can further protect the first lead lines and the second lead lines from being damaged by an external force, or reduce the chance of the first lead lines and the second lead lines from being damaged from an external force.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. A display panel having a display area and a non display area, the display panel comprising:
 a pixel array, located in the display area;
 at least one driving device, located in the non display area;
 a plurality of first lead lines, located in the non display area and electrically connected to the pixel array and the at least one driving device, wherein each of the first lead lines comprises:
  a first straight portion; and
  a first oblique portion, connected with the first straight portion;
 a plurality of second lead lines, located in the non display area and electrically connected to the pixel array and the at least one driving device, wherein the second lead lines and the first lead lines are alternately arranged, and each of the second lead lines comprises:
  a second straight portion;
  a second oblique portion; and
  a contact window, being in contact with the second straight portion so as to electrically connect the second straight portion and the second oblique portion,
 wherein the first straight portions of the first lead lines and the second straight portions of the second lead lines extend towards the driving device and are electrically connected to the driving device.

2. The display panel as claimed in claim 1, wherein the first oblique portions of the first lead lines and the second oblique portions of the second lead lines extend towards the pixel array and are electrically connected to the pixel array.

3. The display panel as claimed in claim 2, wherein a first space between the first straight portion of each first lead line and the second straight portion of the adjacent second lead line is larger than a second space between the first oblique portion of each first lead line and the second oblique portion of the adjacent second lead line near the first straight portion and the second straight portion.

4. The display panel as claimed in claim 3, wherein the first space is between 10 to 20 micrometers, and the second space is between 1.5 to 6 micrometers.

5. The display panel as claimed in claim 1, wherein the second straight portion comprises an extension portion and a connection portion, the connection portion is connected to the second oblique portion, and the contact window is located between the extension portion and the connection portion.

6. The display panel as claimed in claim 5, wherein the first lead lines and the extension portions of the second straight portions of the second lead lines are made of a first conductive layer, and the connection portions of the second straight portions and the second oblique portions of the second lead lines are made of a second conductive layer.

7. The display panel as claimed in claim 6, wherein the first conductive layer is located above or under the second conductive layer.

8. The display panel as claimed in claim 6, further comprising:
 a first insulating layer, covering the first conductive layer, and the second conductive layer being located on the first insulating layer; and
 a second insulating layer, covering the second conductive layer.

9. The display panel as claimed in claim 1, wherein the contact window is located between the second straight portion and the second oblique portion.

10. The display panel as claimed in claim 9, wherein the first lead lines and the second straight portions of the second lead lines are made of a first conductive layer, and the second oblique portions of the second lead lines are made of a second conductive layer.

11. The display panel as claimed in claim 10, wherein the first conductive layer is located above or under the second conductive layer.

12. The display panel as claimed in claim 10, further comprising:
 a first insulating layer, covering the first conductive layer, and the second conductive layer being located on the first insulating layer; and
 a second insulating layer, covering the second conductive layer.

13. The display panel as claimed in claim 10, further comprising:
 a first insulating layer, covering the second conductive layer, and the first conductive layer being located on the first insulating layer; and
 a second insulating layer, covering the first conductive layer.

14. The display panel as claimed in claim 1, further comprising a plurality of protection structures, located between each second lead line and the adjacent first lead line.

15. The display panel as claimed in claim 14, wherein a height of the protection structures are greater than or equal to a height of the first lead lines or a height of the second lead lines.

16. The display panel as claimed in claim 15, wherein the protection structures comprise a plurality of stacked film layers, and a top layer of the film layers is an insulating material.

17. A lead line structure, comprising:
a plurality of first lead lines, each of the first lead lines comprising:
   a first straight portion; and
   a first oblique portion, connected with the first straight portion;
a plurality of second lead lines, the second lead lines and the first lead lines being alternately arranged, and each of the second lead lines comprising:
   a second straight portion;
   a second oblique portion; and
   a contact window, being in contact with the second straight portion so as to electrically connect the second straight portion and the second oblique portion,
wherein a first space between the first straight portion of each first lead line and the second straight portion of the adjacent second lead line is larger than a second space between the first oblique portion of each first lead line and the second oblique portion of the adjacent second lead line near the first straight portion and the second straight portion.

18. The lead line structure of claim 17, wherein the first space is between 10 to 20 micrometers, and the second space is between 1.5 to 6 micrometers.

19. The lead line structure as claimed in claim 17, wherein the second straight portion comprises an extension portion and a connection portion, the connection portion is connected to the second oblique portion, and the contact window is located between the extension portion and the connection portion.

20. The lead line structure as claimed in claim 19, wherein the first lead lines and the extension portions of the second straight portions of the second lead lines are made of a first conductive layer, and the connection portions of the second straight portions of the second lead lines and the second oblique portions of the second lead lines are made of a second conductive layer.

21. The lead line structure as claimed in claim 20, wherein the first conductive layer is located above or under the second conductive layer.

22. The lead line structure as claimed in claim 20, further comprising:
a first insulating layer, covering the first conductive layer, and the second conductive layer being located on the first insulating layer; and
a second insulating layer, covering the second conductive layer.

23. The lead line structure as claimed in claim 20, further comprising:
a first insulating layer, covering the second conductive layer, and the first conductive layer being located on the first insulating layer; and
a second insulating layer, covering the first conductive layer.

24. The lead line structure as claimed in claim 17, wherein the contact window is located between the second straight portion and the second oblique portion.

25. The lead line structure as claimed in claim 24, wherein the first lead lines and the second straight portions of the second lead lines belong to a first conductive layer, and the second oblique portions of the second lead lines belong to a second conductive layer.

26. The lead line structure as claimed in claim 25, wherein the first conductive layer is located above or under the second conductive layer.

27. The lead line structure as claimed in claim 25, further comprising:
a first insulating layer, covering the first conductive layer, and the second conductive layer being located on the first insulating layer; and
a second insulating layer, covering the second conductive layer.

28. The lead line structure as claimed in claim 17, further comprising a plurality of protection structures, located between each first lead line and the adjacent second lead line.

29. The lead line structure as claimed in claim 28, wherein a height of the protection structures are greater than or equal to a height of the first lead lines or a height of the second lead lines.

30. The lead line structure as claimed in claim 28, wherein the protection structures comprise a plurality of stacked film layers, and a top layer of the film layers is an insulating material.

* * * * *